US007492166B2

(12) United States Patent
DeVore

(10) Patent No.: US 7,492,166 B2
(45) Date of Patent: Feb. 17, 2009

(54) METHOD FOR DETERMINING THE SOURCE EQUIVALENT INDUCTANCE OF AN ENERGIZED AC CIRCUIT

(76) Inventor: Timothy Gale DeVore, 835 Moores Mill Dr., Auburn, AL (US) 36830

( * ) Notice: Subject to any disclaimer, the term of this patent is extended or adjusted under 35 U.S.C. 154(b) by 222 days.

(21) Appl. No.: 11/266,665

(22) Filed: Nov. 4, 2005

(65) Prior Publication Data

US 2007/0103123 A1 May 10, 2007

(51) Int. Cl.
*G01R 27/28* (2006.01)

(52) U.S. Cl. .................................... 324/654; 324/76.11

(58) Field of Classification Search ................. 324/654, 324/536, 76.11; 323/207

See application file for complete search history.

(56) References Cited

U.S. PATENT DOCUMENTS 4,191,977 A * 3/1980 Lewkowicz .................. 360/66
5,309,089 A * 5/1994 Kawamura ............... 324/158.1

FOREIGN PATENT DOCUMENTS

JP 05333086 A * 12/1993

OTHER PUBLICATIONS

Introduction to electric circuits, Richard C. Dorf University of California. Davis, Second edition, pp. 151-153.*

* cited by examiner

*Primary Examiner*—Vincent Q Nguyen

(57) ABSTRACT

This method induces a test load on an energized AC electrical system component. This load is switched on for a very brief interval (usually in microseconds). The method includes simultaneously measuring the current response to this pulsed load. From this response, the Equivalent Inductance of the system under test is determined.

1 Claim, 6 Drawing Sheets

D.C. Model.

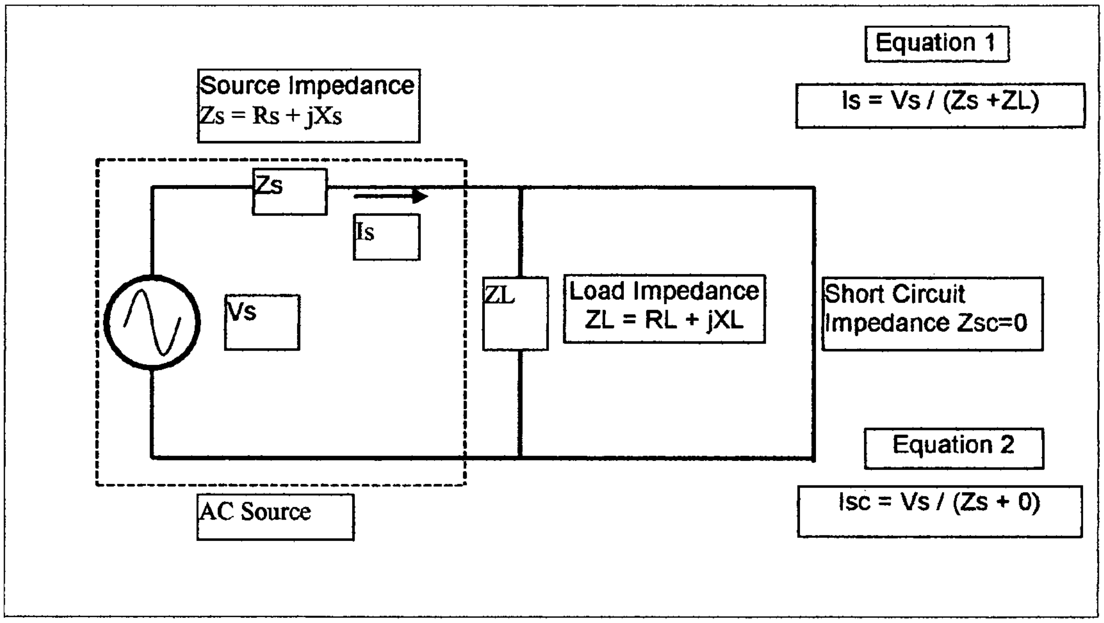
Figure 1. General Equivalent Circuit for Power Sources.

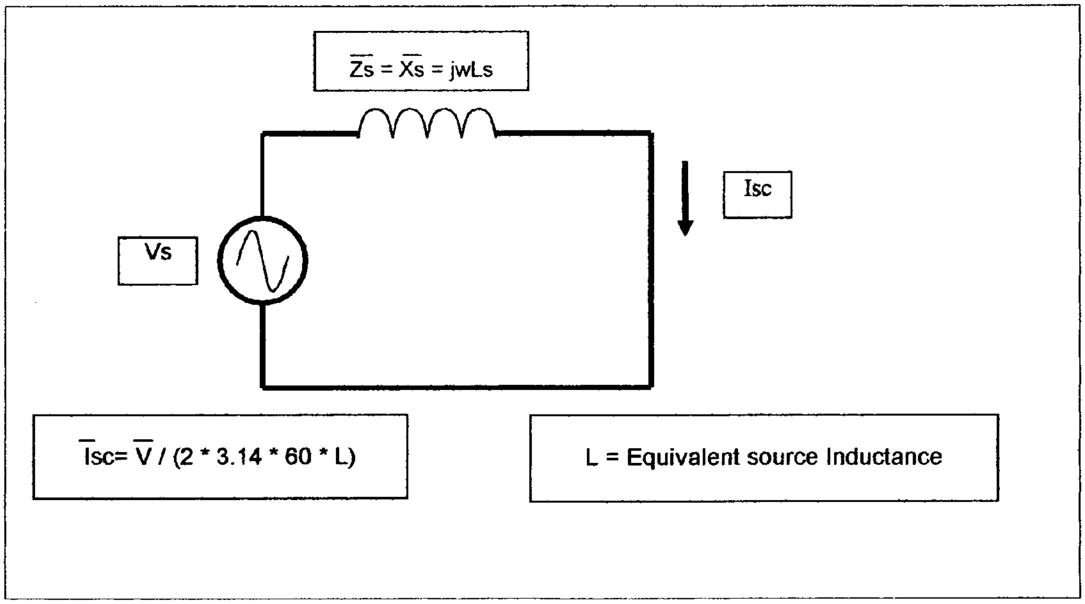
Figure 2. Simplified Equivalent Circuit

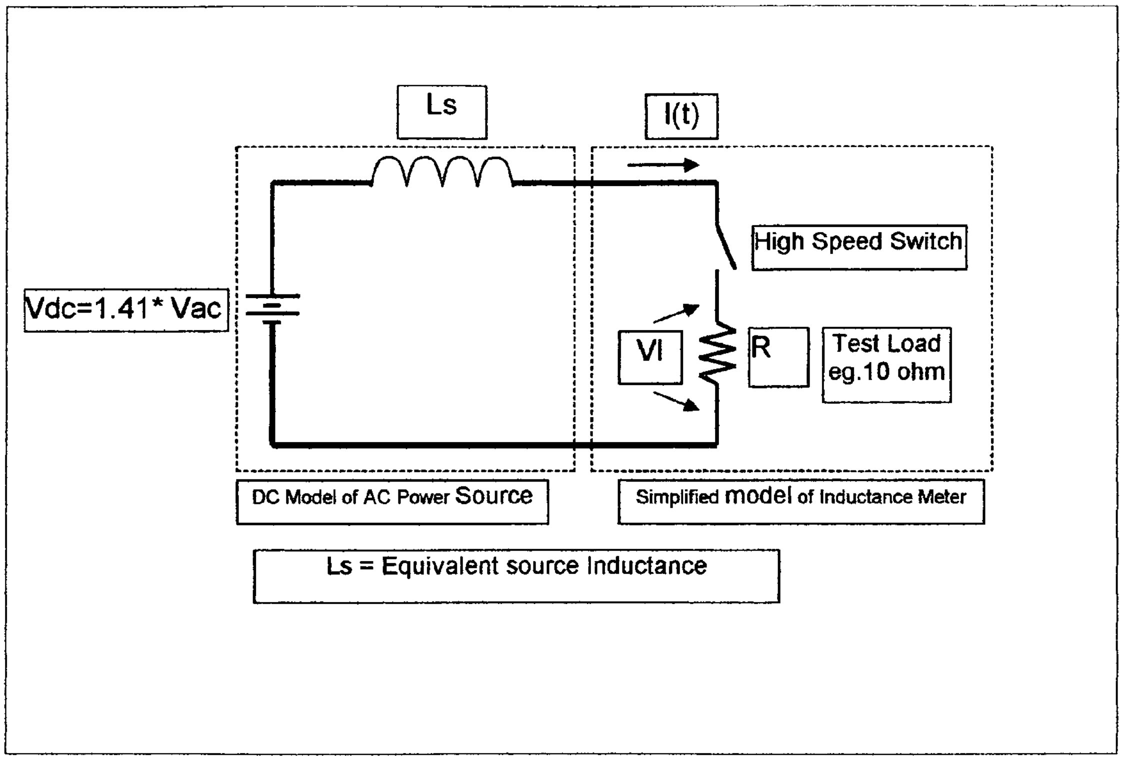
Figure 3. D.C. Model.

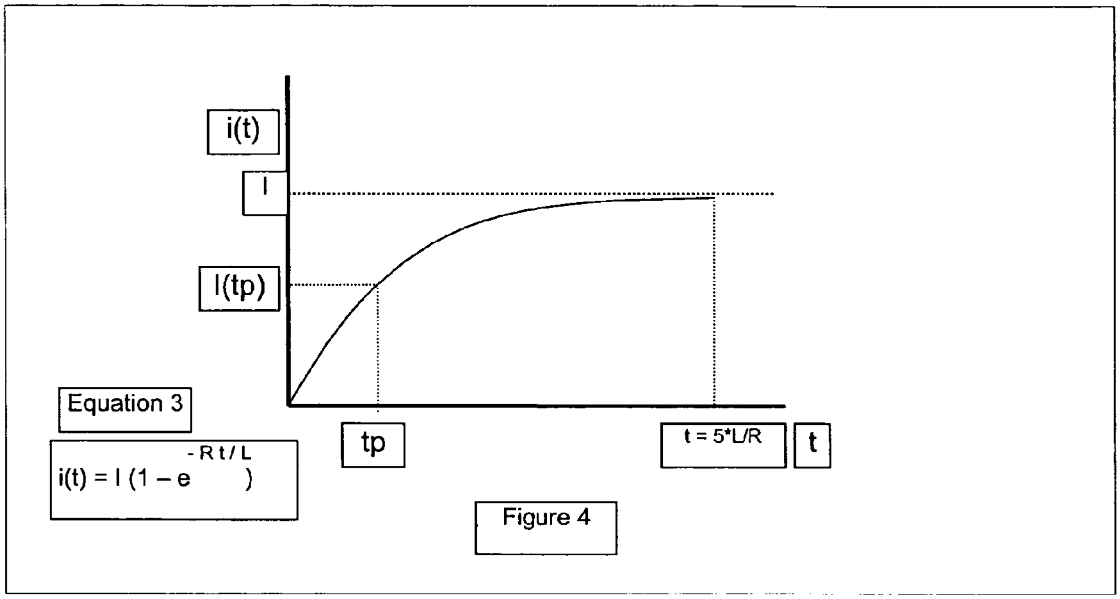
Figure 4. Current Response Curve.

Eq. 3a $$i(Tp) = I\,(1 - e^{-tp * R / L})$$

Eq. 3b $$i(Tp) = I - I\,e^{-tp * R / L}$$

Eq. 3c $$i(Tp) - I = (-I\,e^{-tp * R / L})$$

Eq. 3d $$I - i(Tp) = (I\,e^{-tp * R / L})$$

Eq. 3e $$1 - i(Tp) / I = e^{-tp * R / L}$$

Eq. 3f $$\ln(1 - i(Tp) / I) = -tp * R/L$$

Eq. 4

$$L = (-Tp\,R) / \ln(1 - i(Tp)/I)$$

Figure 5. Equations page 13

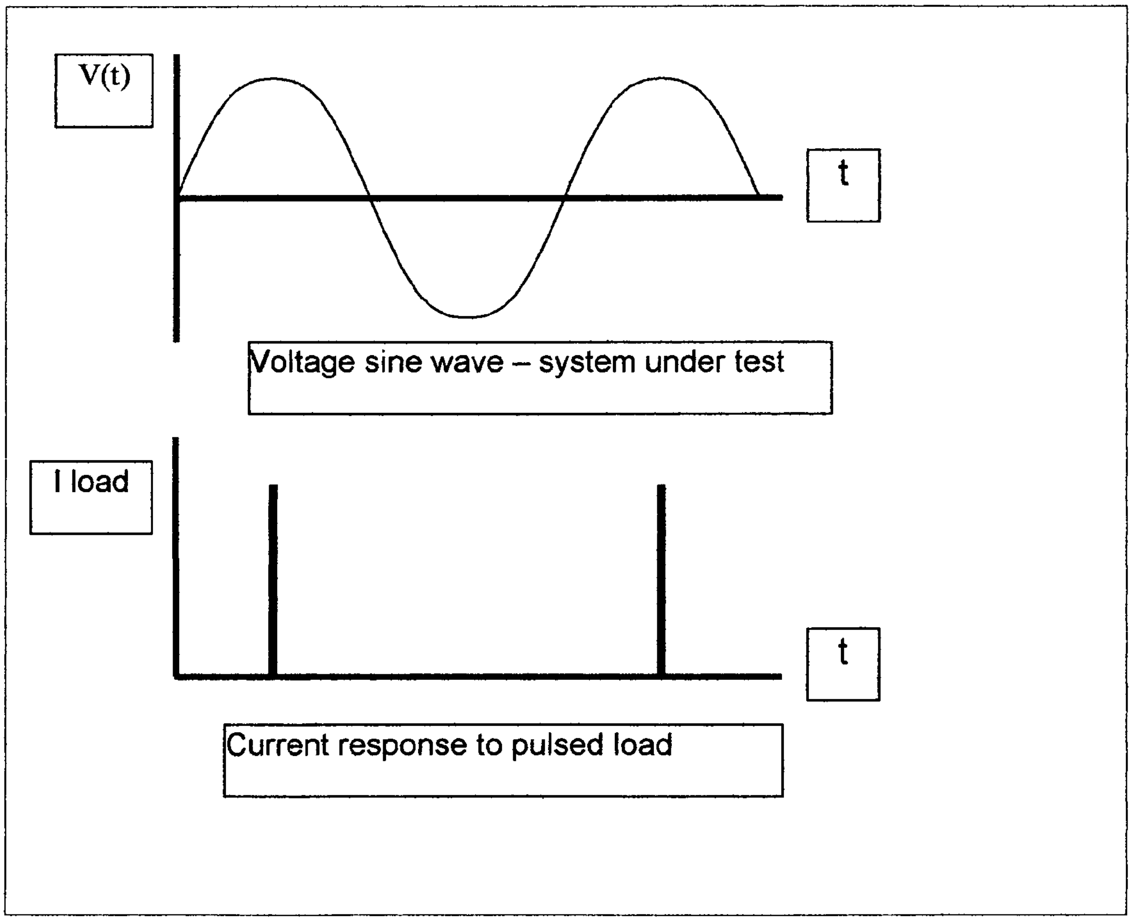
Figure 6. 60 Hz Sine wave with pulse load Current.

METHOD FOR DETERMINING THE SOURCE EQUIVALENT INDUCTANCE OF AN ENERGIZED AC CIRCUIT

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

Awareness of the danger of a phenomenon known as Arc Flash has increased in recent years within the field of electrical system design (Ref. 1). Arc Flash can occur when an electrical short circuit causes an extreme current. This current can destroy the faulting device and leave behind a path of ionized air similar to a small lightning bolt. The resulting light, heat, and pressure can injure or kill nearby personnel (Ref. 2). The capacity of any energized electrical part to generate an Arc Flash is determined by the magnitude of electrical current created by a short circuit at the part. This current magnitude is largely determined by the value of the Equivalent Inductance of the electrical circuit supplying the energized part (Ref. 3).

This available short circuit current value is also important when specifying fuses, breakers and other electrical system components (Ref. 4). Thus the Equivalent Inductance at different points in an electrical distribution system is of great importance to system design and safety.

The value for Equivalent Inductance used in the existing state of technology is estimated in part by the summation of nameplate data for components in the sourcing electrical circuit (Ref. 5). This may involve an extensive review of electrical diagrams. Also a time and labor consuming study of the physical distribution system may be needed to ascertain cable length, routing methods etc. These characteristics are also factored in equations used to estimate Equivalent Inductance at various points in an electrical system (Ref. 5).

Drawbacks to this current state of technology include:

1. The process is complex and expensive.
2. The results can become obsolete when the electrical system is modified.
3. Simplifying assumptions often used degrade the accuracy of the results.
4. The effects of parallel connections of motors, coils or other loads are too numerous and varying to be accurately accounted for.

BRIEF SUMMARY OF THE INVENTION

This invention is a method of measuring of the Equivalent Inductance in the sourcing electrical circuit of an AC electrical component while in its normal and energized state. This method lends itself to implementation in the form of a portable meter which may be conveniently applied at the point of interest. This measurement can then be used within the meter to calculate available short circuit current, arc flash parameters and other data of interest. It is quicker, easier, and less expensive than current methods. Since it measures effects of the actual circuit response, many of the prior simplifications are not needed.

This method includes switching a known resistive load onto the system under test. This load is switched on for a brief period once or at equal intervals relative to the system voltage sine wave. It may be synchronized such that the load is switched on near the peak of the sine wave thus resulting in one load pulse per AC cycle. The load pulse must be short enough as compared to the 60 Hz sine wave as to allow a Direct Current Circuit analysis to be accurate for the duration of the pulse. The pulse duration must also be selected with consideration given to the range of inductance likely in the system under test. For general industrial measurements a useful pulse duration has been determined to be 4 microseconds.

Simultaneously with the duration of the load pulse, the voltage across the known resistive load is monitored. It will rise quickly in response to the supplied source. The peak value it attains at the end of the pulse will also indicate the load current at the end of the pulse. From the known values of Source Voltage, resistive test load value, pulse duration, and peak current during pulse, the value of the source Equivalent Inductance may be calculated.

BRIEF DESCRIPTION OF THE SEVERAL VIEWS OF THE DRAWING

FIG. 1. General Equivalent Circuit for Power Sources.
FIG. 2. Simplified Equivalent Circuit with Equations.
FIG. 3. D.C. Model.
FIG. 4. Current Response Curve.
FIG. 5. Equations.
FIG. 6. 60 Hz Sine wave with pulse load Current.

DETAILED DESCRIPTION OF THE INVENTION

AC. Circuit Model

According to the venin's theorem of circuit equivalency an AC Power Source may be modeled by an infinite source Vs in series with an impedance which characterizes the effect a current load has on the power source (Ref. 6). This is illustrated in FIG. 1. Also in FIG. 1 is shown the schematic orientation of a normal load along with that of a short circuit.

Without a short circuit the current Is is limited by the series combination of the source impedance Zs and the load impedance ZL (Equation 1). However since the impedance of a short circuit approaches zero, short circuit current is limited only by the source impedance (Equation 2).

For power distribution networks the net equivalent reactance is correctly assumed to be inductive reactance. Furthermore the ratio of reactance to resistance is usually high enough such that resistance can be ignored or assigned an estimated value and still retains sufficient accuracy for AC short circuit calculations. The effects of these assumptions on FIG. 1 are shown in FIG. 2.

For a 60 Hz system, AC inductive reactance magnitude in ohms is computed by the formula $$X=2\pi 60L.$$

Where L in FIG. 2 is the Equivalent Inductance of the power source.

Thus it is seen that for electrical power distribution networks, that the magnitude of the available short circuit current at any point is largely determined by the source Equivalent Inductance.

DC Circuit Model

FIG. 3 illustrates the same circuit from a DC perspective (Ref. 7). The DC source voltage is considered to be the peak voltage of the previous AC sine wave. This is the previous RMS value multiplied by the square root of 2. Also illustrated is a switch and test load to help describe the method of inductance evaluation in question.

With the switch open, the current is zero. Upon switch closure the current rises as illustrated in FIG. 4. The formula for the current in this circuit is shown as Equation 3 (Ref. 8). The time required for the current to stabilize is considered to be 5 times L divided by R. For a measured time to stabilize (t) and a known resistance R, the inductance L=(tR)/5. The final value of I is seen to be Vs/R.

However, if the switch opens at the end of a load pulse interval (tp), the current will have risen to a value given as i(tp), If these values are inserted in Equation 3 and solved for L (Equations 3a through 4, FIG. 5) it is seen that the value for Equivalent Inductance may be calculated by this method. Several points of clarification must be made as follows:

The effect of source resistance is neglected as it is very small compared to the test Resistance.

The switch in the schematic in an actual implementation is a transistor or similar device.

The method is valid as a one point sample but may also use a multipoint average.

The inventors' contention is that, with the pulse duration adequately shorter than the AC Cycle, that the DC equations and analysis result in valuable results.

Any and all simplifications and or omissions in this explanation do not materially affect The validity of the results.

Load Pulse

As stated earlier, the timing and duration of the load pulse (illustrated by switch on and off cycle in FIG. 3) is a key to this method. It should start near the top of the AC sine wave of the system under test. This is because the voltage changes at a slower rate in this area thus making a DC evaluation easier and more accurate. If the method is implemented by taking multiple samples (the inventor's choice) then the pulse should start at close to the same voltage magnitude every time for overall accuracy.

The duration of the load pulse must be short relative to the rate of change of the AC sine wave voltage during the pulse interval. There is no defined ratio for this relationship. However, to the extent this relationship is true, the more accurate the method will be.

Implementation

The inventors implementation of this method is complex involving substantial circuitry and programming, none of which bears on the method as described. Any engineer or designer with experience with microprocessor based development can take the method as herein described and develop a valuable and important innovation. However, as a point of reference the inventors implementation includes the following; The microcontroller PIC18C4610 by Microchip Corporation is the heart of the device. The microcontrollers' A to D and comparator sub-systems are programmed and adapted to sense the top of the sine wave. A common operational amplifier circuit is used in a "peak hold" configuration to capture the voltage (and thus the current) transient across the load resistor. The microcontroller has binary I/O one of which functions as a driver for an insulated gate bipolar transistor (International Rectifier IRG4PF50WD) which functions as a high speed switch. The program is developed in "C" computer language with a compiler which includes a function for "natural logarithm" used in the method. The microcontroller is also connected to a numeric display and a keypad for user interface.

The invention claimed is:

1. A method of determining the source equivalent inductance of an energized electrical distribution system at a point of measurement comprising the steps of:

applying a predetermined resistive load to the point of measurement at which time the sinusoidal voltage of the energized electrical distribution system is near the maximum or minimum peak value;

during applying the predetermined resistive load, measuring the current flowing on the predetermined resistive load, measuring the time required for the measured current to reach its stabilized peak value;

correlating the relationship of the DC resistance applied and source inductance response;

determining the source equivalent inductance of the energized electrical distribution system at the point of measurement based on the measured current and time and the relationship of DC resistance and inductance transient circuits.

* * * * *